(12) United States Patent
Choi

(10) Patent No.: US 9,508,428 B2
(45) Date of Patent: Nov. 29, 2016

(54) VERTICAL TYPE SEMICONDUCTOR DEVICE, FABRICATION METHOD THEREOF AND OPERATION METHOD THEREOF

(71) Applicant: SK hynix Inc., Gyeonggi-do (KR)

(72) Inventor: Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/019,185

(22) Filed: Feb. 9, 2016

(65) Prior Publication Data

US 2016/0155937 A1 Jun. 2, 2016

Related U.S. Application Data

(62) Division of application No. 13/967,827, filed on Aug. 15, 2013, now Pat. No. 9,287,325.

(30) Foreign Application Priority Data

Mar. 6, 2013 (KR) .................. 10-2013-0024122

(51) Int. Cl.
*H01L 27/24* (2006.01)
*G11C 13/00* (2006.01)
*H01L 29/66* (2006.01)
*H01L 45/00* (2006.01)
*H01L 27/22* (2006.01)

(52) U.S. Cl.
CPC ......... *G11C 13/0004* (2013.01); *G11C 13/004* (2013.01); *H01L 27/228* (2013.01); *H01L 27/2454* (2013.01); *H01L 29/66666* (2013.01); *H01L 45/04* (2013.01); *H01L 45/06* (2013.01); *H01L 45/065* (2013.01); *H01L 45/1206* (2013.01); *H01L 45/1233* (2013.01); *H01L 45/1253* (2013.01); *H01L 45/146* (2013.01); *H01L 45/147* (2013.01); *H01L 45/1608* (2013.01); *H01L 45/1683* (2013.01)

(58) Field of Classification Search
CPC .................. H01L 27/2454; H01L 29/66666; H01L 45/1608; H01L 45/1683; G11C 13/0004; G11C 13/0007
See application file for complete search history.

(56) References Cited

U.S. PATENT DOCUMENTS

| 7,212,432 B2 * | 5/2007 | Ferrant | ..................... G11C 8/14 257/E27.005 |
| 8,183,126 B2 * | 5/2012 | Lee | ........................ H01L 27/101 257/379 |
| 8,207,032 B2 * | 6/2012 | Fischer | ........... H01L 21/823425 438/206 |

* cited by examiner

*Primary Examiner* — Allison P Bernstein
(74) *Attorney, Agent, or Firm* — IP & T Group LLP

(57) ABSTRACT

A vertical type semiconductor device and a fabrication method thereof are provided. The vertical type semiconductor device includes a pillar structure having a stacking structure of a conductive layer and a data storage material and formed on a common source region, and a gate electrode formed to surround the data storage material of the pillar structure.

14 Claims, 18 Drawing Sheets

VERTICAL TYPE SEMICONDUCTOR DEVICE, FABRICATION METHOD THEREOF AND OPERATION METHOD THEREOF

CROSS-REFERENCES TO RELATED APPLICATION

This application is a division of U.S. patent application Ser. No. 13/967,827 filed on Aug. 15, 2013, which claims priority under 35 U.S.C. 119(a) to Korean application number 10-2013-0024122, filed on Mar. 6, 2013, in the Korean Intellectual Property Office. The disclosure of each of the foregoing applications is incorporated herein by reference in its entirety.

BACKGROUND

1. Technical Field

The inventive concept relates to a semiconductor device, and more particularly, to a vertical type semiconductor device, a fabrication method thereof, and an operation method thereof.

2. Related Art

With demands on semiconductor devices with ultra-high integration, ultra-high speed, and ultra-low power applied to electronic apparatuses which are increasingly miniaturized, vertical type memory devices have been actively studied.

In recent years, the resistive memory devices are drawing attention as next-generation memory devices and have adopted the vertical structure. The resistive memory devices select cells through access devices. The resistive memory devices are devices configured to store data by changing a resistance state of a data storage material electrically connected thereto. As an example of the resistive memory devices, there are phase-change random access memory devices (PCRAMs), resistive RAMs (ReRAMs), and magnetic RAMs (MRAMs).

As the access devices of the resistive memory devices, diodes or transistors are adopted. In particular, the transistors have received attention as the access device of the resistive memory devices since the transistors have a low operation voltage through controlling of a threshold voltage thereof to be lowered as compared with the diodes and the vertical structure of the transistors is adopted.

That is, there is a limit to lowering an operation voltage of the diodes since a voltage of above 1.1 V has to be applied to the diodes. When the diodes are formed on a word line, resistance of the word line is changed according to a location of cell to cause word line bouncing.

A reduction rate of the transistors having a horizontal structure is limited but the vertical transistors may ensure sufficient current drivability in a restricted area. Further, the vertical transistors may improve a voltage drop component due to an external resistor through reduction in a source resistance.

On the other hand, the access devices such as the diodes and the transistors are formed using a semiconductor substrate as a base. In recent years, the semiconductor memory devices are formed in multiple layers to obtain high integration. When the access devices are formed using the semiconductor substrate as a base, it is impossible to stack several layers.

SUMMARY

According to one aspect of an exemplary implementation, there is provided a vertical type semiconductor device. The vertical type semiconductor device may include: a pillar structure having a stacking structure of a conductive layer and a data storage material and formed on a common source region; and a gate electrode formed to surround the data storage material of the pillar structure.

According to another aspect of an exemplary implementation, there is provided a method of fabricating a vertical type semiconductor device. The method may include: forming pillar structures, each of the pillar structures in which a conductive layer and a first insulating layer are stacked, on a common source region; forming a gate insulating layer and a gate electrode material on the common source region including the pillar structures; removing the gate electrode material to a predetermined height to insulate gate electrode materials to at least one direction; forming a second insulating layer on the common source region including the gate electrode materials to bury between the pillar structures, planarizing the second insulating layer to expose a surface of the first insulating layer, and removing the first insulating layer; and burying a data storage material in a space from which the first insulating layer is removed.

According to another aspect of an exemplary implementation, there is provided a method of fabricating a vertical type semiconductor device. The method may include: forming a pillar structure in which a conductive layer and a data storage material are stacked on a common source region; forming a gate insulating layer and a gate electrode material on the common source region including the pillar structure; and removing the gate electrode material to a predetermined height to insulate gate electrode materials to at least one direction.

According to another aspect of an exemplary implementation, there is provided a method of operating a vertical type semiconductor device which includes a pillar structure having a stacking structure of a conductive layer and a data storage material, a gate electrode formed to surround the data storage material of the pillar structure, and an interconnection layer electrically connected to the pillar structure and disposed on the pillar structure. The method may include applying a voltage for changing the data storage material into a high-resistance state to the gate electrode and the interconnection layer in response to an initialization command.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
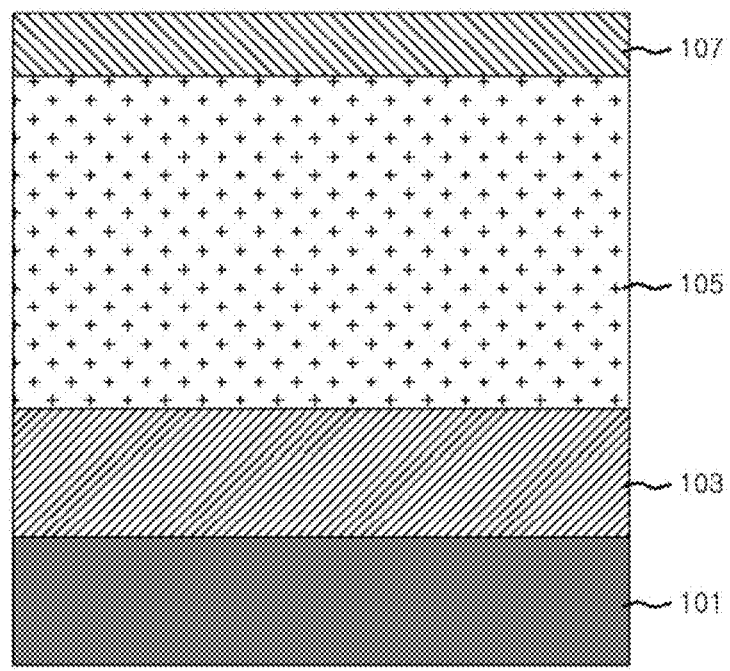
FIGS. 1A to 9C are views illustrating a method of fabricating an exemplary vertical type memory device.

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

In drawings, (a) is a cross-sectional view of a vertical type memory device in a first direction (an X direction), for example, a word line extending direction, (b) is a plan view of the vertical type memory device, and (c) a cross-sectional view of the vertical type memory device in a second direction (a Y direction), for example, a bit line extending direction. Further, if necessary, the cross-sectional view in the second direction as illustrated in (c) may be illustrated.

FIGS. 1A to 9C are views illustrating a method of fabricating an exemplary vertical type memory device.

Figure 1B:
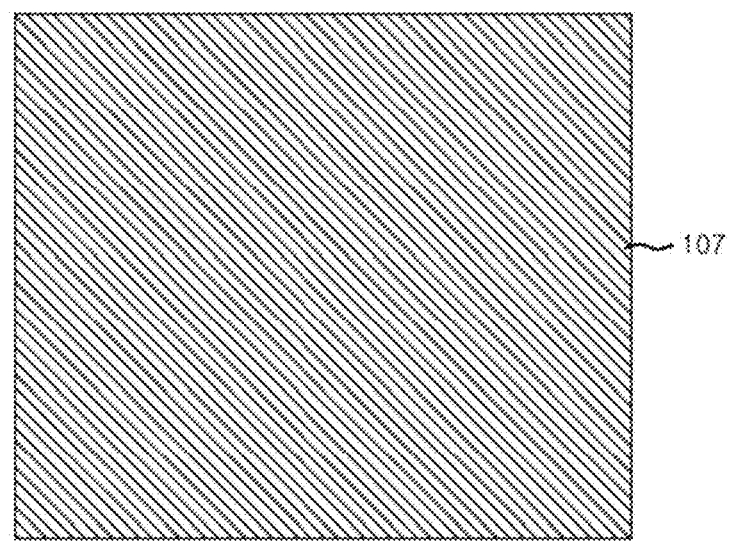

First, as illustrated in FIGS. 1A and 1B. 1, a conductive layer 103, a first insulating layer 105, and a hard mask 107 are sequentially formed on a common source region 101 of a semiconductor substrate.

Here, the common source region 101 may be formed of a conductive material, such as a metal, but it is not limited thereto. The common source region 101 may be formed through an ion implantation process.

Figure 2A:
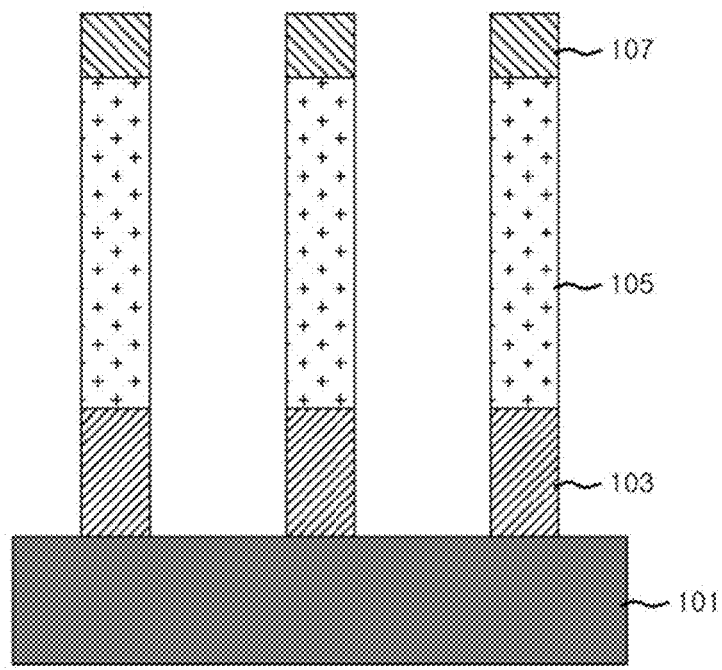
Figure 2B:
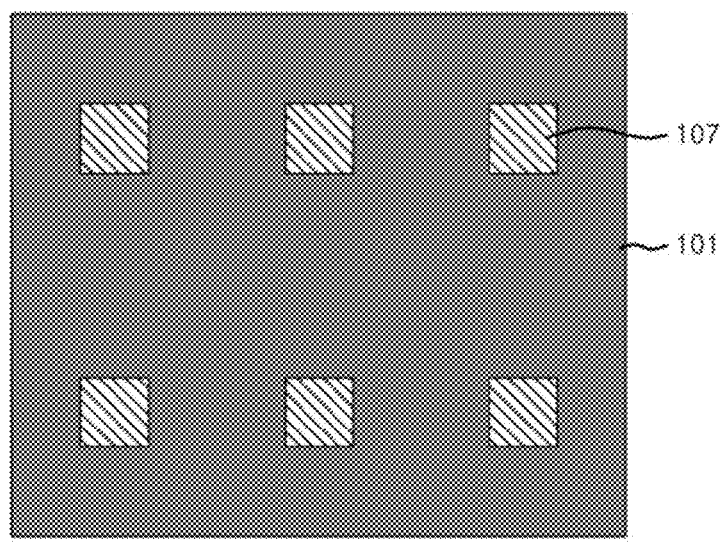

Next, as illustrated in FIGS. 2A and 2B, the hard mask 107 is patterned in a substantially pillar shape, and the first insulating layer 105 and the conductive layer 103 are patterned using the hard mask 107 as an etch mask to form a pillar structure.

Figure 3A:
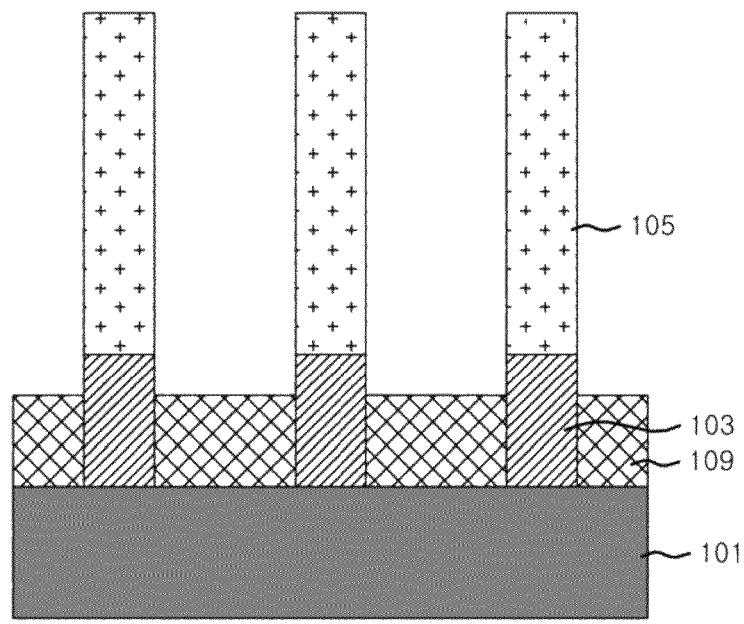
Figure 3B:
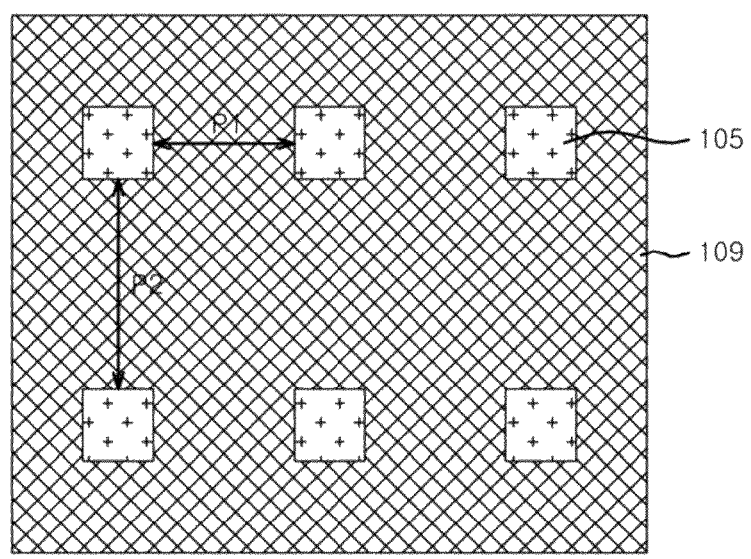

After the forming of the pillar structure, as illustrated in FIGS. 3A and 3B, the hard mask 107 is removed and a second insulating layer 109 may be formed, to a predetermined height, between a surface of the common source region 101 and a top of the conductive layer 103. More specifically, the second insulating layer 109 is formed on the common source region 101, having the pillar structure as illustrated in FIGS. 2A and 2B, and planarized. Then, a wet or dry etching process is performed on the second insulating layer 109 so that the second insulating layer 109 is recessed to be lower than the top of the conductive layer 103. The process forming the second insulating layer 109 is performed to more ensure cell separation and may be omitted in an alternative implementation.

Figure 4A:
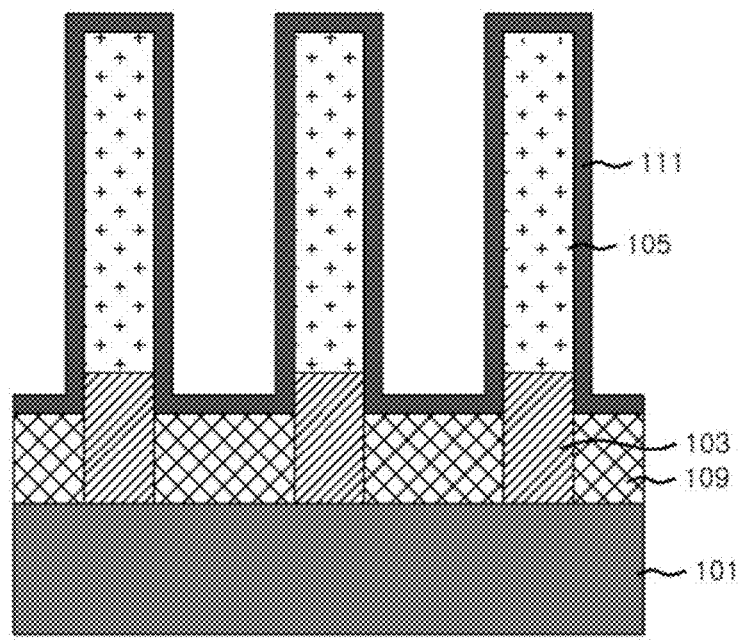
Figure 4B:
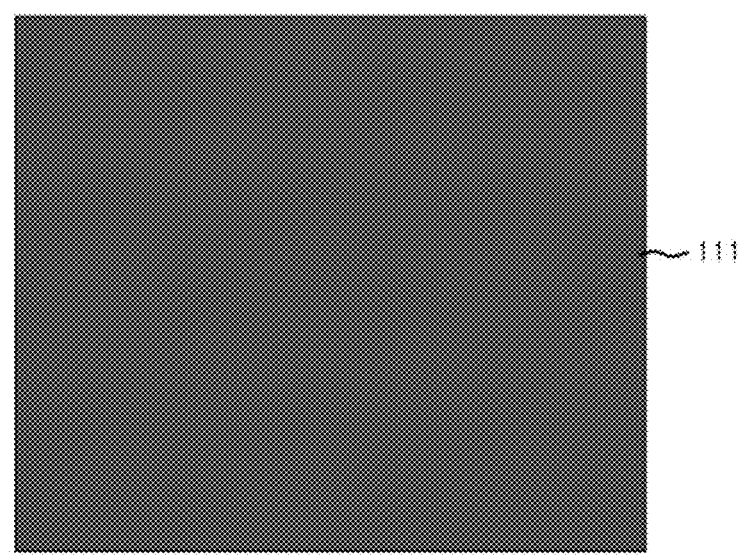

As illustrated in FIGS. 4A and 4B, a gate insulating layer 111 is formed on an exposed surface of the pillar structure.

Figure 5A:
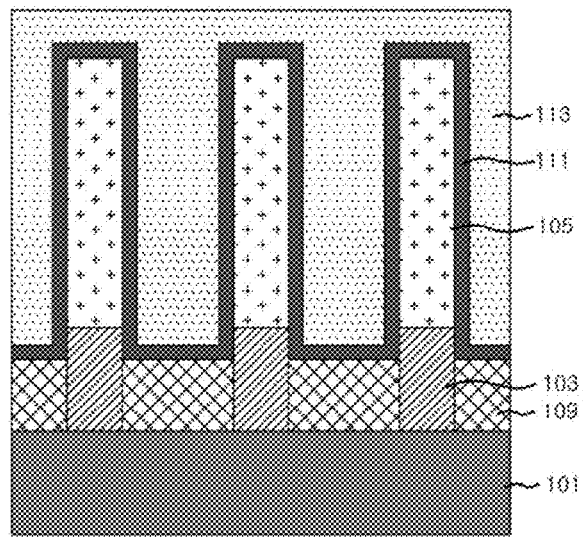
Figure 5B:
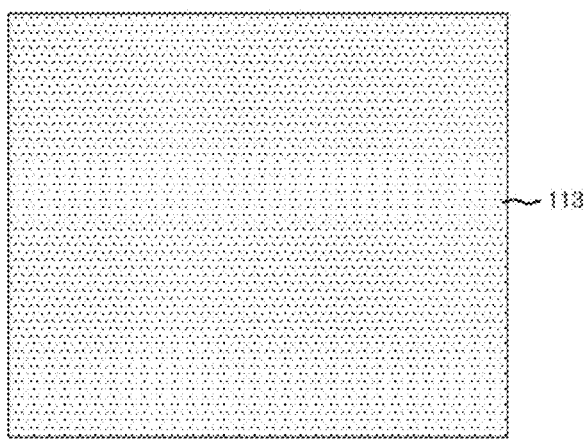
Figure 5C:
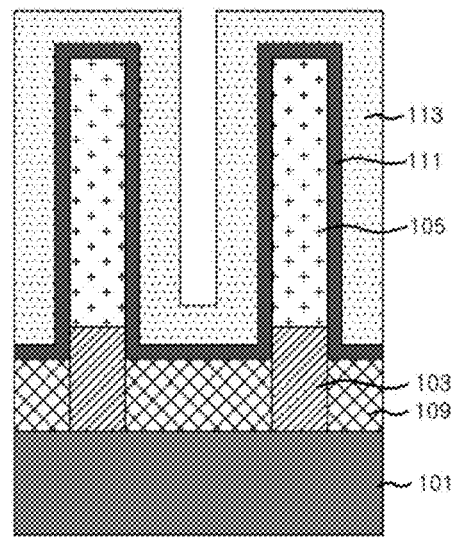

As illustrated in FIGS. 5A to 5B, after the gate insulating layer 111 is formed, a gate electrode material 113 is formed on the gate insulating layer 111. Since the pillar structure may be formed so that a space P2 between pillar structures in the second (Y) direction is larger than a space P1 between pillar structures in the first (X) direction as illustrated in FIGS. 3A and 3B, the gate electrode material 113 is formed to have a step between the pillar structures formed in the second direction as illustrated in FIG. 5C.

Figure 6A:
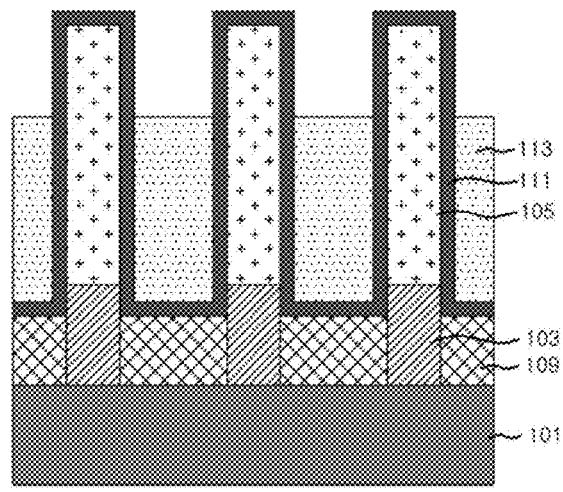
Figure 6B:
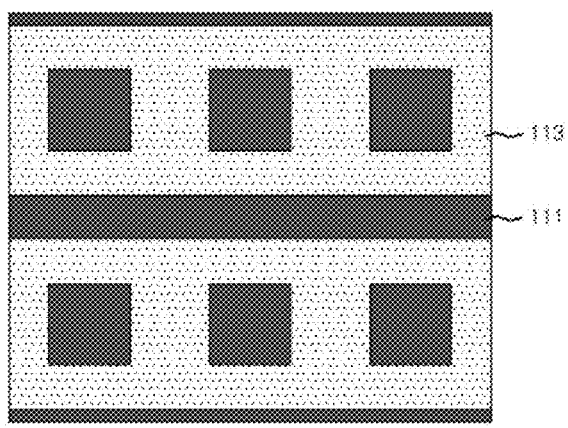
Figure 6C:
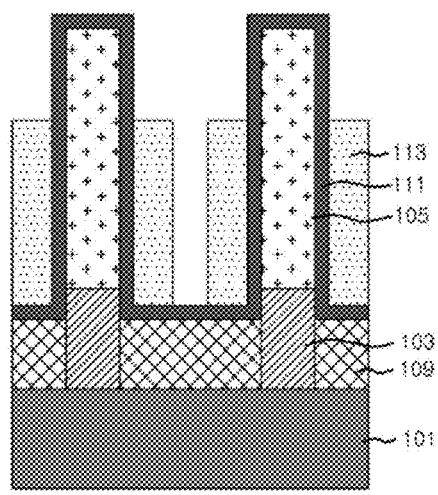

As illustrated in FIGS. 6A to 6C, the gate electrode material 113 is removed to a predetermined height so that insulation between gate electrode material 113 in the second direction is obtained. At this time, if the pillar structures are designed so that the space P1 between the pillar structures in the first direction is smaller than the space P2 between the pillar structures in the second direction as illustrated in FIGS. 3A and 3B, then the gate electrode material 113 in the first direction may not be insulated and connected to each other.

Figure 7A:
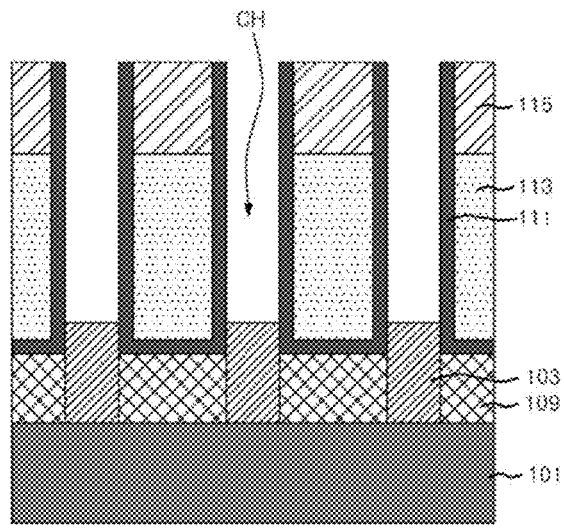
Figure 7B:
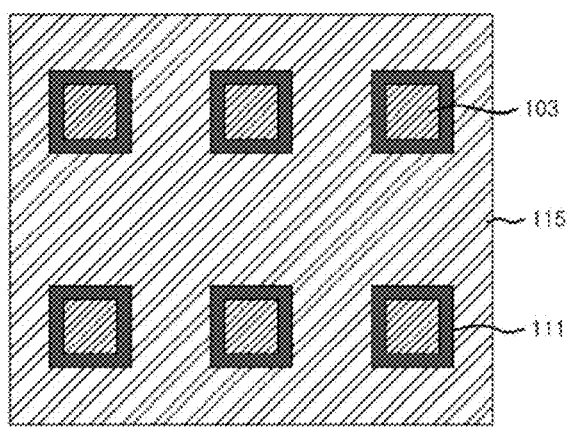
Figure 7C:
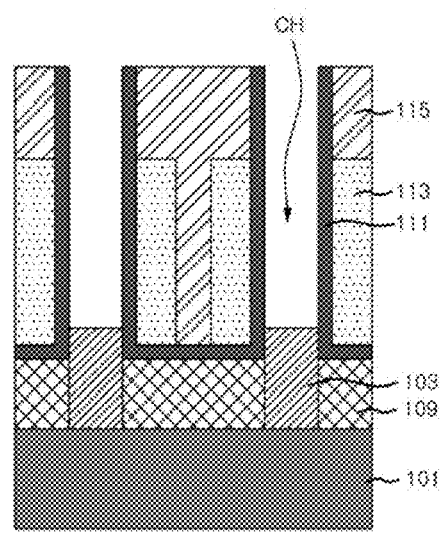

As illustrated in FIGS. 7A to 7C, a third insulating layer 115 is formed between the pillar structures and planarized to expose a top of the first insulating layer 105. The exposed first insulating layer 105 is selectively removed to form a channel region CH that exposes a top of the conductive layer 103.

Figure 8A:
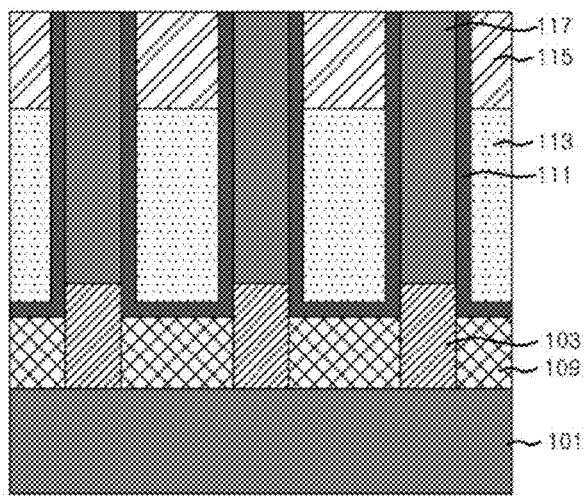
Figure 8B:
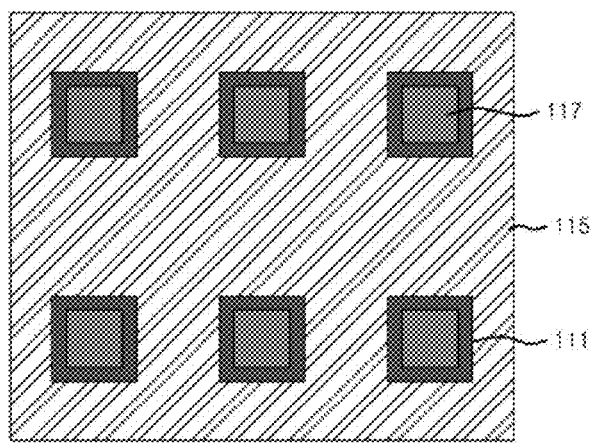
Figure 8C:
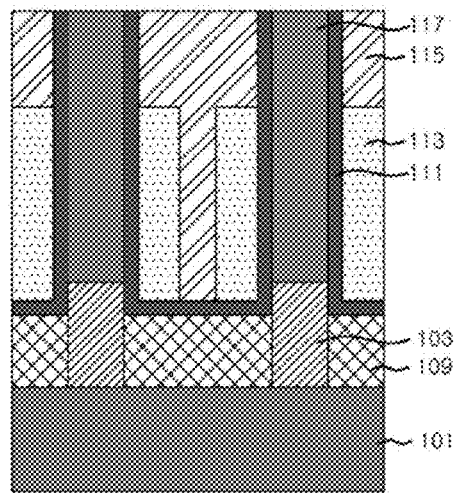

As illustrated in FIGS. 8A to 8C, a data storage material 117 is formed on the common source region 101 and in the channel region CH. The data storage material 117 is planarized to expose a surface of the third insulating layer 115. Therefore, the data storage material 117 is buried in the channel region CH and is electrically connected to the conductive layer 103.

The data storage material 117 may include a phase-change material, such as germanium (Ge)-antimony (Sb)-tellurium (Te). Preferably, the data storage material 117 may include an amorphous phase-change material. Alternatively, instead of a phase-change material, the data storage material 117 may include Perovskite, a transition metal oxide, or the like.

After the channel region CH is formed as illustrated in FIGS. 7A to 7C, a spacer may be formed on an inner wall of the channel region CH and the data storage material 117 may be formed. When the spacer is formed on the inner wall of the channel region CH, a contact area between the data storage material 117 and the conductive layer 103 may be reduced to reduce a reset current. At this time, the spacer may be formed of an insulating material different from the gate insulating layer 111. For example, if the gate insulating layer 111 include an oxide layer, then the spacer may be formed using a nitride. However, the material for the spacer is not limited thereto.

In an exemplary implementation, the data storage material 117 may include a phase-change material, a crystalline phase-change material, an amorphous phase-change material, and a crystalline phase-change material sequentially formed in the channel region CH. A portion of the data storage material 117 in which the amorphous phase-change material layer may be formed may serve as a channel region.

Further, if the data storage material 117 includes Perovskite or a transition metal oxide, a first barrier metal layer, a Perovskite material (or transition metal oxide), and a second barrier metal layer may be sequentially formed in the channel region CH. A portion of the data storage material 117 in which the Perovskite material or transition oxide may be formed may serve as a channel region.

In another implementation, before the data storage material 117 is formed, a thickness of the gate insulating layer 111 in which data is to be stored is increased and then the data storage material 117 is formed to reduce a reset current.

That is, in the exemplary implementation, the data storage material 117 is used as a channel region of a vertical transistor. In particular, the amorphous phase-change material has electrical characteristics of a P-type semiconductor having many traps for electrons. Further, if the transistor is used as an access device, then is no need for forming a separate memory cell on the access device. Thus, the data storage material 117 in the channel region may be used as a data storage region. Therefore, since the vertical transistor simultaneously serves as the access device and the memory cell, the semiconductor device with ultra-high integration and ultra-miniaturization may be obtained. Further, a detailed driving method of the semiconductor device will be described later with reference to FIGS. 10A and 10B.

Figure 9A:
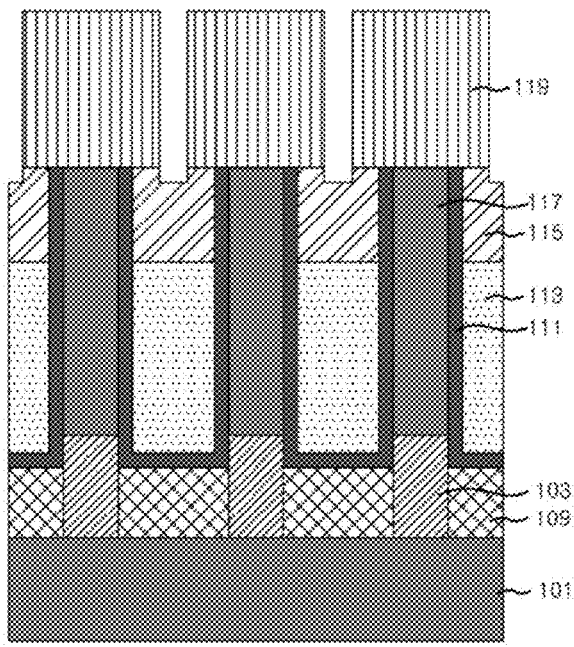
Figure 9B:
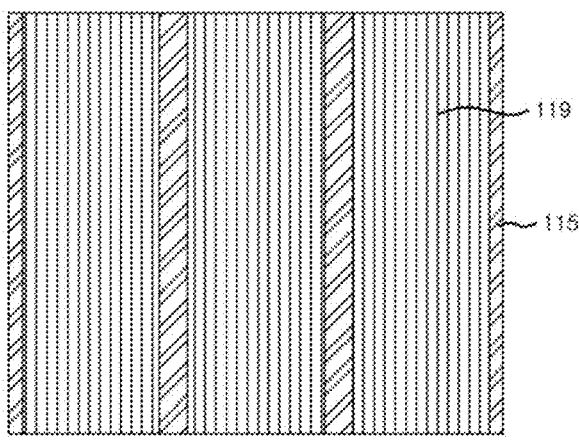
Figure 9C:
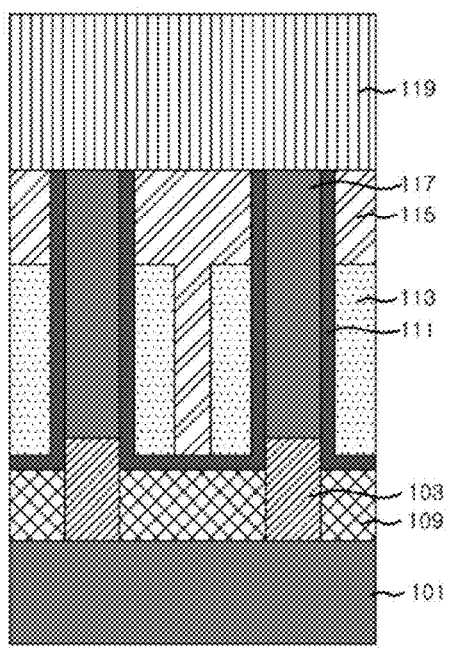

After the data storage material 117 is buried in the channel region CH, as illustrated in FIGS. 9A to 9C, an interconnection layer, for example, a bit line 119 electrically connected to the data storage material 117 may be formed and patterned to extend in the second direction.

Figure 10A:
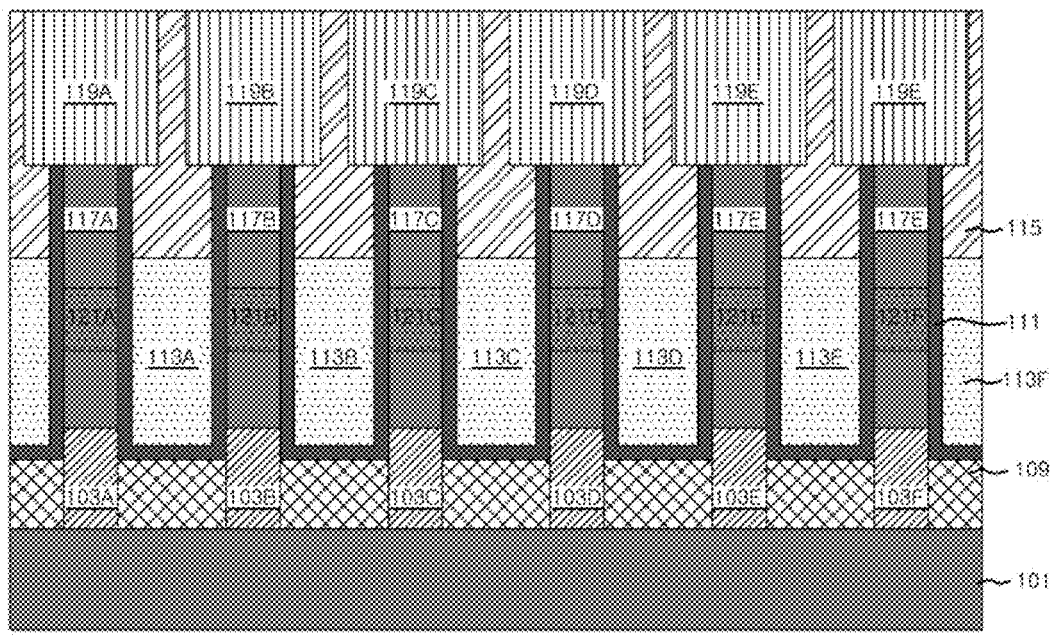
FIGS. 10A and 10B are views illustrating an operation method of an exemplary vertical type memory device.
Figure 10B:
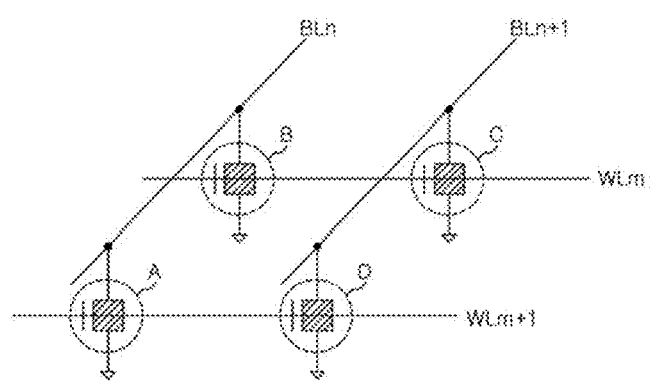

FIGS. 10A and 10B are views illustrating an operation method of an exemplary vertical type memory device.

It can be seen that electrical I-V characteristics of the amorphous phase-change material have P-type semiconductor characteristics having many traps. Therefore, the channel region of the vertical transistor may be formed using the amorphous phase-change material.

Since the data storage material of the semiconductor device completed through processes of FIGS. 1A to 9C has a low-resistance state (a crystalline state if a phase-change material is used), all the data storage materials have a low-resistance characteristic. Therefore, in a test mode, all data storage materials are changed into a high-resistance state through a fire-out operation for initialization. Therefore, the data storage material 117 simultaneously performs a data storage function and a channel function of the transistor. That is, the data storage material 117 functions as a transistor function and as a memory cell.

Referring to FIGS. 10A and 10B, it is assumed that when a read operation perform by turned-on first and second transistors, a write operation perform by turned-on third and fourth transistors, and then fifth and sixth transistors are turned-off.

In FIG. 10A, a first transistor may include a conductive layer 103A, a phase-change material 117A, and a gate electrode 113A, and a second transistor may include a conductive layer 103B, a phase-change material 117B, and a gate electrode 113B. A third transistor may include a conductive layer 103C, a phase-change material 117C, and a gate electrode 113C, and a fourth transistor may include a conductive layer 103D, a phase-change material 117D, and a gate electrode 113D. A fifth transistor may include a conductive layer 103E, a phase-change material 117E, and a gate electrode 113E, and a sixth transistor may include a conductive layer 103F, a phase-change material 117F, and a gate electrode 113F. Further, the phase-change materials 117A to 117F may be configured so that portions of the phase-change materials 117A to 117F that store are formed of amorphous phase-change materials 121A to 121F.

FIG. 10B illustrates that if a specific cell A is selected, then non-selected memory cells B, C, and D share or do not share bit lines and word lines with the specific cell A.

When a read operation is performed on the selected cell A (may be the first or second transistor), voltages may be applied to the bit lines and the word lines of the selected cell A and the non-selected cells B, C, and D as illustrated in Table 1.

TABLE 1

| Read Operation | Selected Cell (A) | Non-selected cell (B) sharing bit line with selected cell | Non-selected cell (c) not sharing bit line/word line with selected cell | Non-selected cell (D) sharing word line with selected cell |
| --- | --- | --- | --- | --- |
| Bit Line | 1 V | 1 V | 0 V | 0 V |
| Word Line | 2 V or its less | 0 V or its less | 0 V or its less | 2 V or its less |

In the read operation, a voltage that is insufficient to change crystalline states (i.e., resistance states) of the phase-change materials 117A and 117B, but is sufficient to turn on the first and second transistors, may be applied to the selected cell A. Therefore, the resistance states, that is, the data levels stored by the phase-change materials 117A and 117B are differentiated based on the resistance states of the phase-change materials 117A and 117B. For example in a read mode, a positive voltage (for example, 1 V), which is insufficient to change the states of the phase-change materials 117A and 117B, may be applied to the bit line. A second positive voltage (for example, 2 V), which is higher than the first positive voltage, may be applied to the word line.

If a write operation is performed on the selected cell A (may be the third or fourth transistor), voltages may be applied to the bit lines and the word lines of the selected cell A and the non-selected cells B, C, and D as illustrated in Table 2.

TABLE 2

| Write Operation | Selected Cell | Non-selected cell sharing bit line with selected cell | Non-selected cell not sharing bit line/word line with selected cell | Non-selected cell sharing word line with selected cell |
| --- | --- | --- | --- | --- |
| Bit Line | 2 V | 2 V | 0 V | 0 V |
| Word Line | 2 V or less | 0 V or less | 0 V or less | 2 V or less |

The voltages applied in the write operation may be sufficient to change crystalline states (i.e. resistance states) of the phase-change materials 117C and 117D and to simultaneously turn on the third and fourth transistors. For example, a third positive voltage (for example, 2 V), which is sufficient to change crystalline states (i.e. resistance states) of the phase-change materials, may be applied to the bit line of the selected cell. A fourth positive voltage (for example, 1 V), which is less than or equal to the third positive voltage, may be applied to the word line.

Therefore, in this state, new data may be recorded in the phase-change materials 117C and 117D.

A voltage applied to the cell C not sharing the bit line and the word line with the selected cell in the read or write operation may be determined to have a level not change crystalline states of the phase-change materials 117E and 117F and simultaneously a level to turn off corresponding transistors (the fifth or sixth transistors of FIG. 10A). For example, a ground voltage may be applied to the first and second bit lines 119E and 119F and the ground voltage or a negative voltage (for example, −2 V) having a predetermined level may be applied to the gate electrodes 113E and 113F. At this time, the phase-change materials 117E and 117F are completely depleted, the fifth and sixth transistors turn off, and thus the fifth and sixth transistors become non-selected transistors.

Further, the ground voltage or a negative voltage (for example, −2 V) having a predetermined level may be applied to the word line of the non-selected memory cell B sharing the bit line with the selected cell A in the read or write operation and the ground voltage may be applied to the bit line of the non-selected cell C sharing the word line with the selected cell so that the corresponding transistors turn off.

FIGS. 11A to 18C are views illustrating a vertical type memory device according to another exemplary implementation of the inventive concept.

Figure 11A:
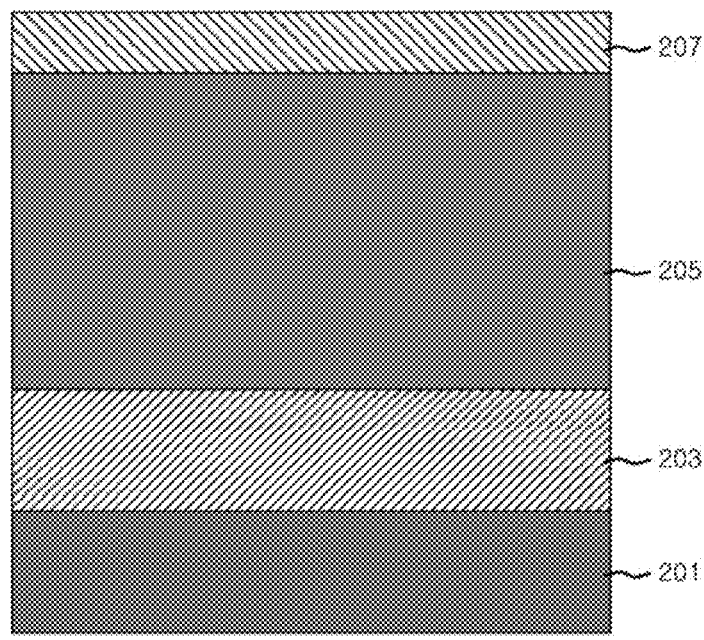
FIGS. 11A to 18C are views illustrating a method of fabricating an exemplary vertical type memory device.
Figure 11B:
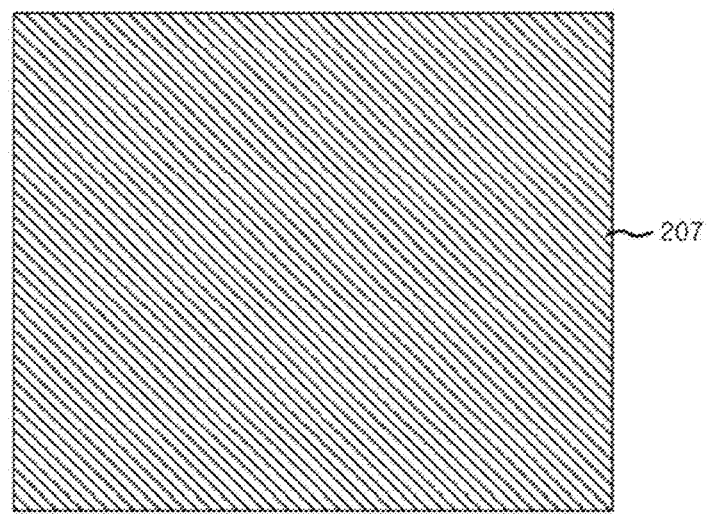

First, as illustrated in FIGS. 11A and 11B, a conductive layer 203, a data storage material 205, and a hard mask 207 are sequentially formed on a common source region 201 of a semiconductor substrate.

Here, the common source region 201 may be formed of a conductive material such as a metal, but it is not limited thereto and the common source region 201 may be formed through an ion implantation process.

Further, the data storage material 205 may include a phase-change material, more preferably, amorphous phase-change material. In particular, when the data storage material 205 includes a phase-change material, a crystalline phase-change material, an amorphous phase-change material, and a crystalline phase-change material may be sequentially formed. In another implementation, the data storage material 205 may include a Perovskite material, transition metal oxide, and the like. The data storage material may have a stacking structure of a first barrier metal layer, a Perovskite material (or transition metal oxide), and a second barrier metal layer.

Figure 12A:
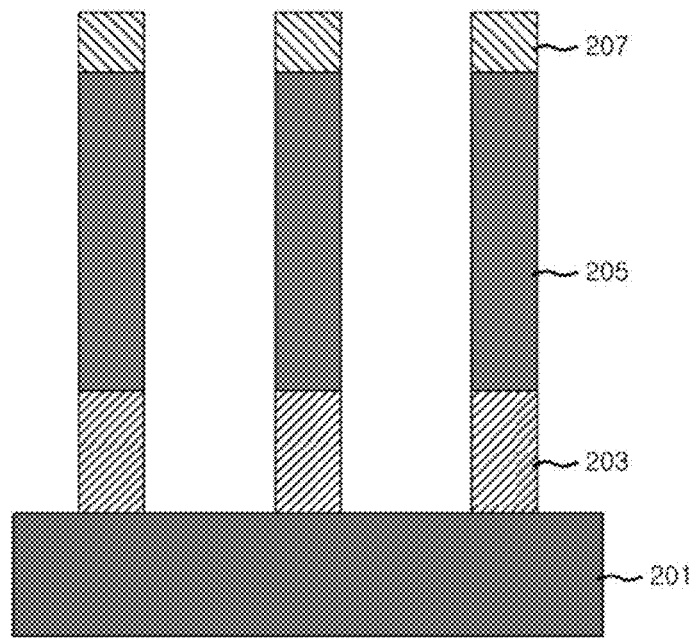
Figure 12B:
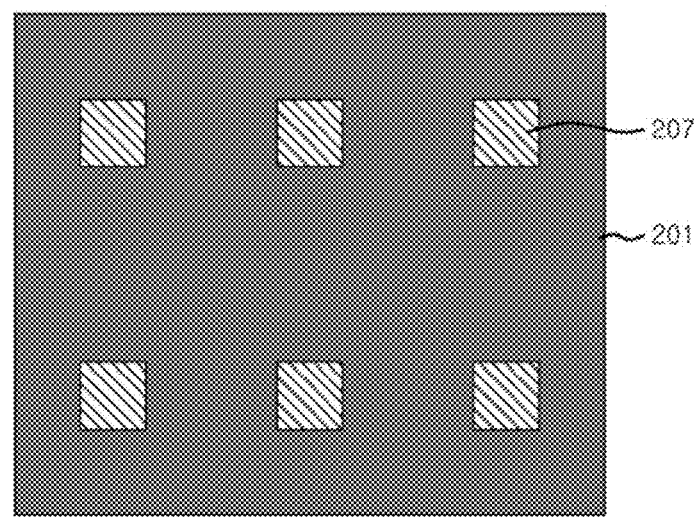

Next, as illustrated in FIGS. 12A and 12B, the hard mask 207 is patterned in a pillar shape and the data storage material 205 and the conductive layer 203 are patterned using the hard mask 207 as an etch mask to form a pillar structure. At this time, when the pillar structures are designed so that a space between pillar structures in the second (Y) direction is larger than a space between pillar structures in the first (X) direction, but the inventive concept is not limited thereto.

Figure 13A:
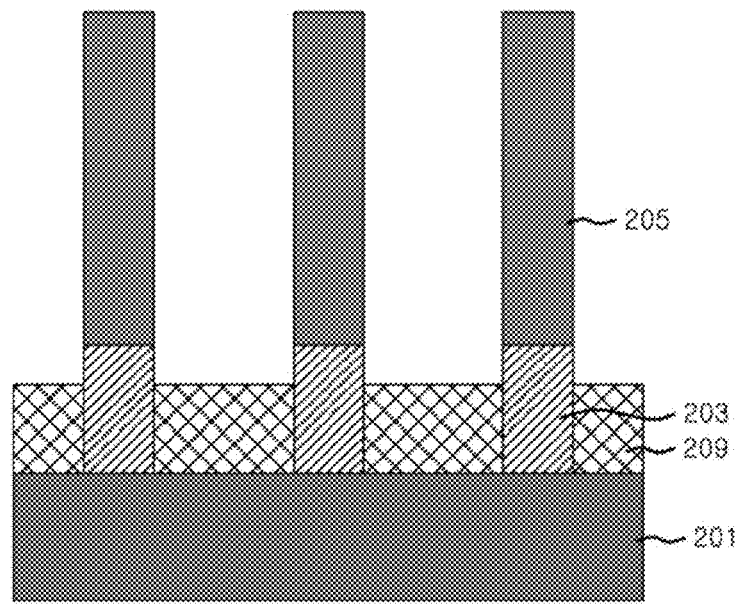
Figure 13B:
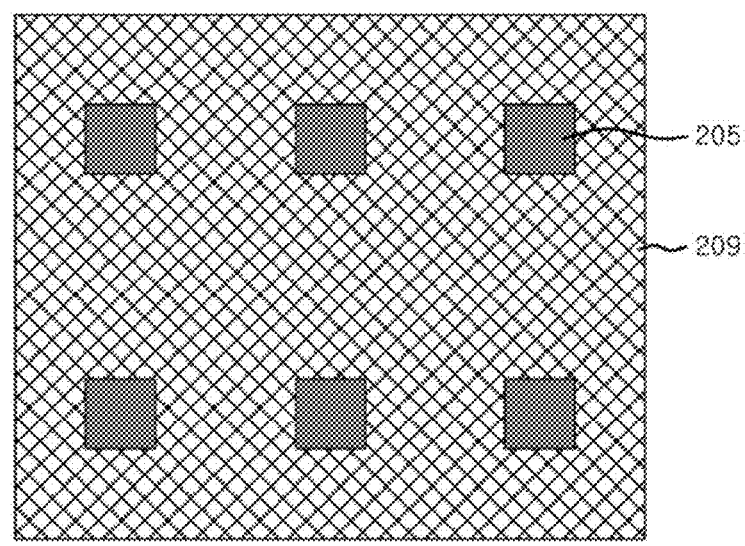

After the forming of the pillar structure, as illustrated in FIGS. 13A and 13B, the hard mask 207 is removed and a second insulating layer 209 may be buried to a predetermined height between a surface of the common source region 201 and a top of the conductive layer 203. More specifically, the second insulating layer 209 is formed on the common source region 201 having the pillar structure and planarized. Then, a wet or dry etching process is performed on the second insulating layer 209 so that the second insulating layer 209 is recessed to be lower than the top of the conductive layer 203. The process of burying the second insulating layer 209 may be omitted.

Figure 14A:
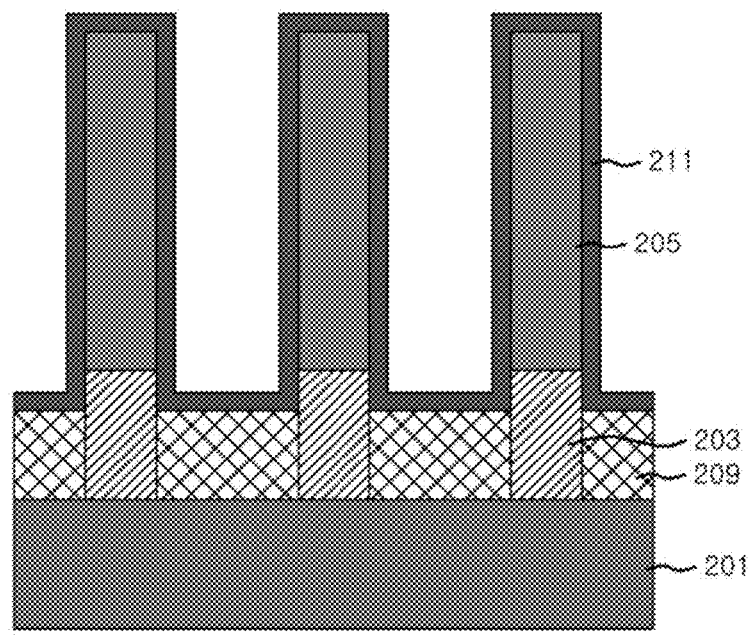
Figure 14B:
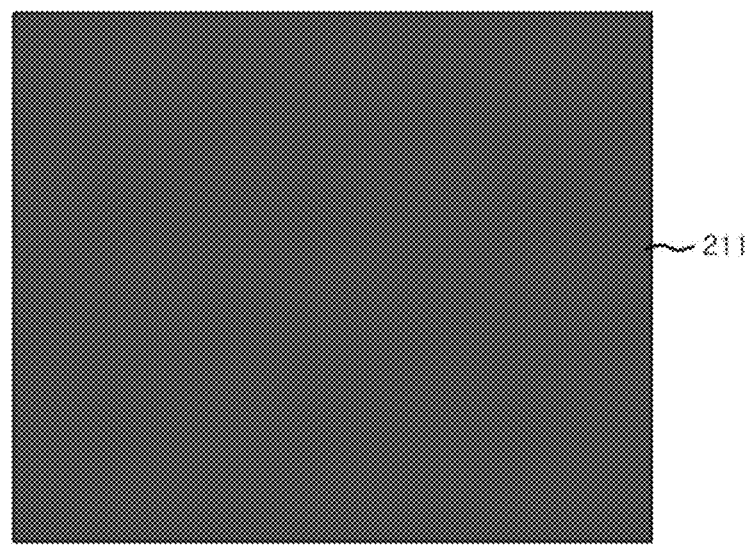
Figure 15A:
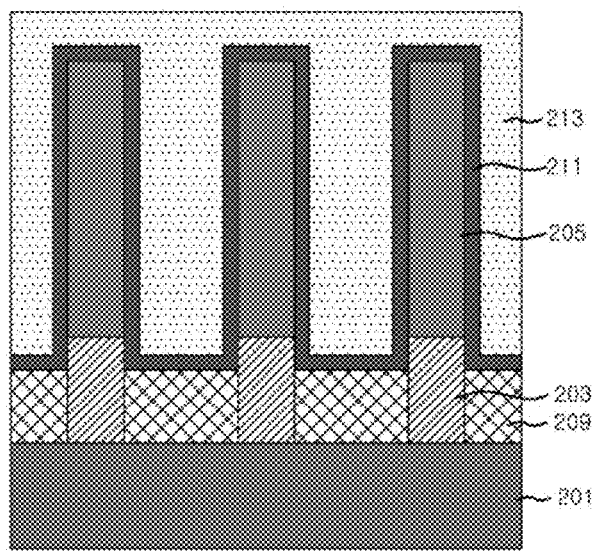
Figure 15B:
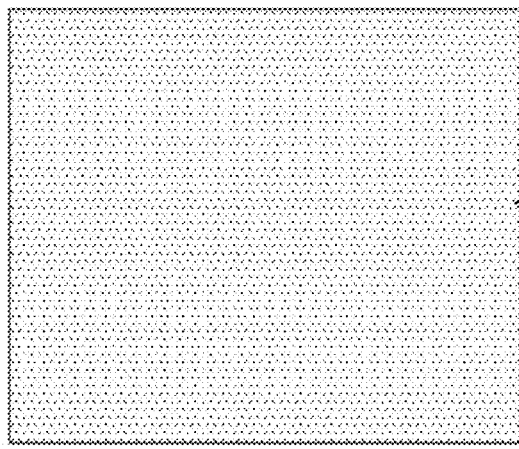
Figure 15C:
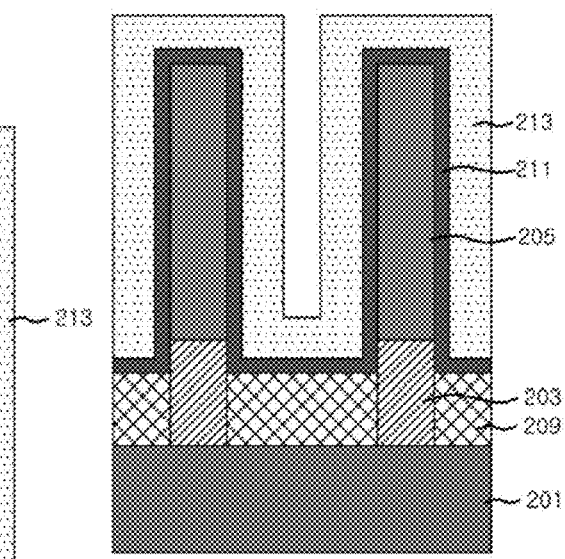

As illustrated in FIGS. 14A and 14B, a gate insulating layer 211 is formed on an exposed surface of the pillar structure and as illustrated in FIGS. 15A to 15C, a gate insulating material 213 is formed on the gate insulating layer 211. Since the pillar structure may be formed so that the space between the pillar structures in the second (Y) direction is larger than the space between pillar structures in the first (X) direction, the gate electrode material 213 is formed to have a step between the pillar structures formed in the second direction.

Figure 16A:
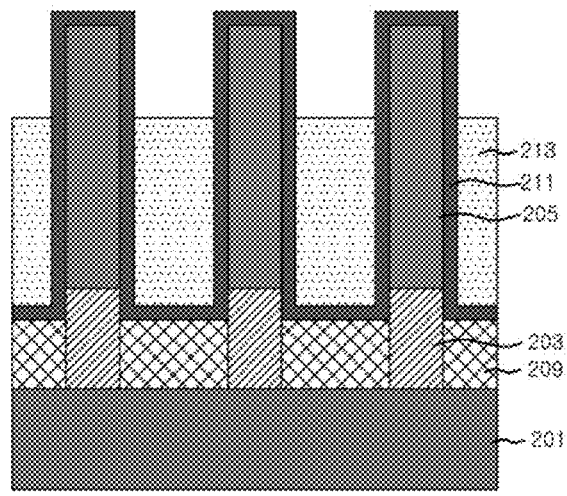
Figure 16B:
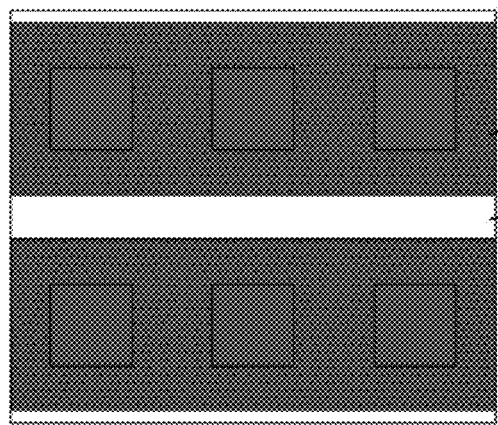
Figure 16C:
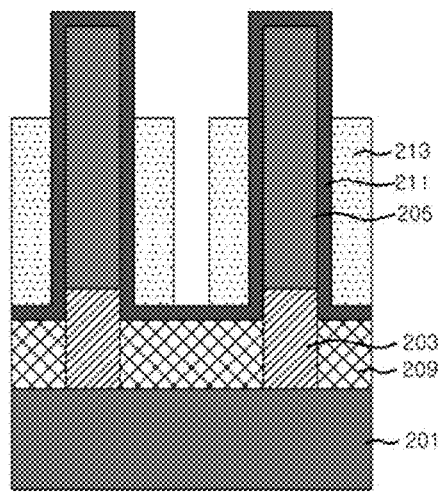

As illustrated in FIGS. 16A to 16C, the gate electrode material 213 is removed to a predetermined height so that insulation between gate electrode materials 213 in the second direction is obtained. At this time, the gate electrode materials in the first direction may not be insulated and connected to each other.

Figure 17A:
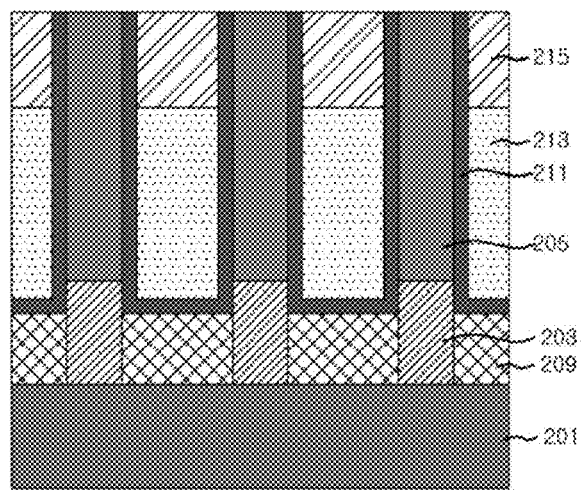
Figure 17B:
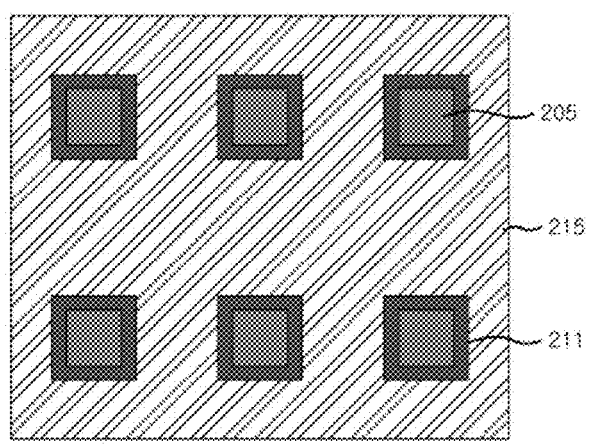
Figure 17C:
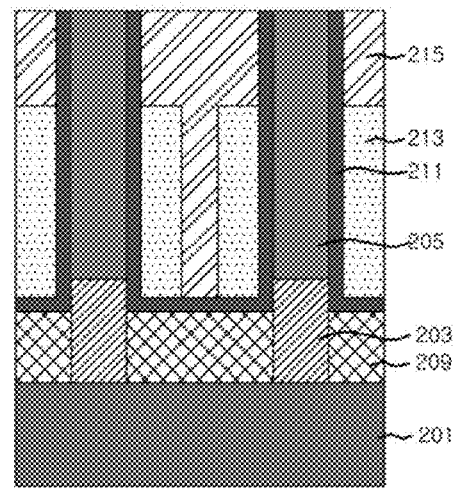

As illustrated in FIGS. 17A to 17C, a third insulating layer 215 is formed on the common source region including the gate electrode materials and planarized to expose a top of the data storage material 205. Therefore, the vertical transistor using the data storage material 205 as a channel region is completed.

Figure 18A:
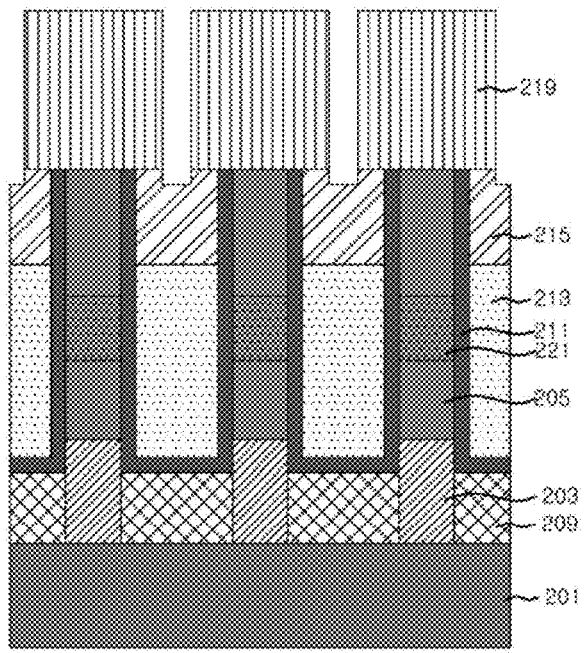
Figure 18B:
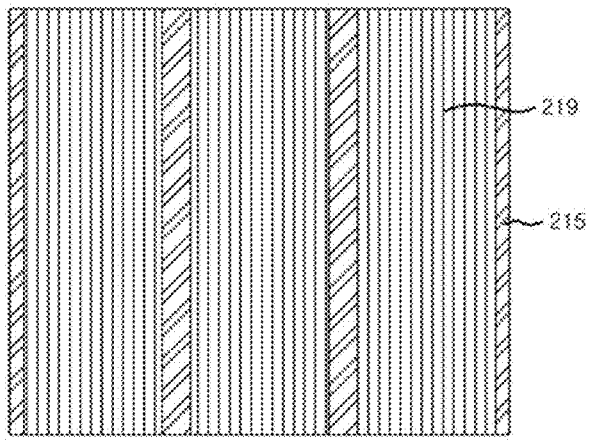
Figure 18C:
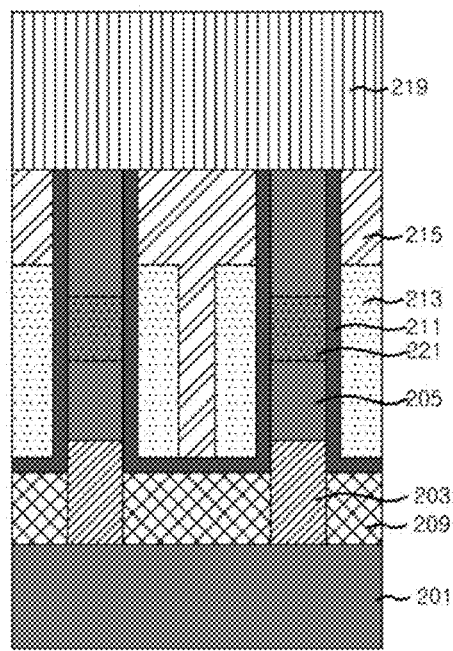

As illustrated in FIGS. 18A to 18C, an interconnection layer, for example, a bit line 219 electrically connected to the data storage material 205 is formed and then patterned to the second direction. In FIGS. 18A to 18C, a portion 211 of the data storage material 205 denotes a portion in which data is stored, for example, amorphous phase-change material layer or a Perovskite layer (or a transition metal oxide layer).

In the exemplary implementation, the pillar structure is formed to include the data storage material. Therefore, the fabrication process is more simplified.

It has described that the vertical type semiconductor device is formed in a single layer, but the vertical type semiconductor device according to the inventive concept may be formed to have a stacking structure, that is, a multi-level stack (MLS) structure. At this time, the vertical type semiconductor device may be applied and modified in various structures so that the cell structures illustrated in FIGS. 9A to 9C or FIGS. 18A to 18C are equally sequentially stacked, the cell structures are symmetrically stacked in a mirror based on the interconnection layer (the bit line), or the cell structures are symmetrically stacked in a mirror based on the common source region.

That is, since the process subsequent to the process of forming the vertical transistor is a low temperature process, thermal effect is not applied to the lower layer even when a plurality of layers are stacked. Therefore, fabrication of the stacked semiconductor device is possible. Further, since additional access device is unnecessary, the semiconductor device with high integration and high performance may be implemented.

The above implementation of the present invention is illustrative and not limitative. Various alternatives and equivalents are possible. The Invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a vertical type semiconductor device, the method comprising:
    forming pillar structures, each of the pillar structures in which a conductive layer and a first insulating layer are stacked, on a common source region;
    forming a gate insulating layer and a gate electrode material on the common source region including the pillar structures;
    removing the gate electrode material to a predetermined height to insulate gate electrode materials to at least one direction;
    forming a second insulating layer on the common source region including the gate electrode materials to bury between the pillar structures, planarizing the second insulating layer to expose a surface of the first insulating layer, and removing the first insulating layer; and
    burying a data storage material in a space from which the first insulating layer is removed.

2. The method of claim 1, wherein the data storage material includes a phase-change material.

3. The method of claim 1, wherein the data storage material is formed to have a stacking structure of a crystalline phase-change material, an amorphous phase-change material, and a crystalline phase-change material.

4. The method of claim 1, wherein the data storage material includes Perovskite or transition metal oxide.

5. The method of claim 1, wherein the data storage material has a stacking structure of a first barrier metal layer, a Perovskite layer, and a second barrier metal layer or a stacking structure of a first barrier metal layer, a transition metal oxide layer, and a second barrier metal layer.

6. The method of claim 1, further comprising forming a spacer on an inner wall of the space from which the first insulating layer is removed after the removing of the first gate insulating layer.

7. The method of claim 1, further comprising increasing a thickness of a predetermined portion of the gate insulating layer after removing of the first insulating layer.

8. The method of claim 1, further comprising forming an interconnection layer to be electrically connected to the data storage material.

9. A method of fabricating a vertical type semiconductor device, the method comprising:
   forming a pillar structure in which a conductive layer and a data storage material are stacked on a common source region;
   forming a gate insulating layer and a gate electrode material on the common source region including the pillar structure; and
   removing the gate electrode material to a predetermined height to insulate gate electrode materials to at least one direction.

10. The method of claim 9, wherein the data storage material includes a phase-change material.

11. The method of claim 9, wherein the data storage material is formed to have a stacking structure of a crystalline phase-change material, an amorphous phase-change material, and a crystalline phase-change material.

12. The method of claim 9, wherein the data storage material includes Perovskite or transition metal oxide.

13. The method of claim 9, wherein the data storage material has a stacking structure of a first barrier metal layer, a Perovskite layer, and a second barrier metal layer or a stacking structure of a first barrier metal layer, a transition metal oxide layer, and a second barrier metal layer.

14. The method of claim 9, further comprising forming an interconnection layer to be electrically connected to the data storage material.

* * * * *